(12) United States Patent
Brunschwiler et al.

(10) Patent No.: US 9,433,077 B2
(45) Date of Patent: Aug. 30, 2016

(54) SUBSTRATE DEVICE AND ELECTRIC CIRCUIT ARRANGEMENT HAVING FIRST SUBSTRATE SECTION PERPENDICULAR TO SECOND SUBSTRATE SECTION

(71) Applicant: INTERNATIONAL BUSINESS MACHINES CORPORATION, Armonk, NY (US)

(72) Inventors: Thomas J. Brunschwiler, Thalwil (CH); Dominic Gschwend, Zürich (CH); Keiji Matsumoto, Yokohama (JP); Stefano S. Oggioni, Milan (IT); Gerd Schlottig, Uitikon (CH); Timo J. Tick, Rueschlikon (CH); Jonas Zuercher, Chur (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/599,672

(22) Filed: Jan. 19, 2015

(65) Prior Publication Data

US 2015/0237729 A1 Aug. 20, 2015

(30) Foreign Application Priority Data

Feb. 14, 2014 (IT) .............. MI2014A0224

(51) Int. Cl.
*H01L 21/76* (2006.01)
*H05K 1/02* (2006.01)
*H01L 23/14* (2006.01)
*H01L 23/373* (2006.01)
(Continued)

(52) U.S. Cl.
CPC ............. *H05K 1/0206* (2013.01); *H01L 23/14* (2013.01); *H01L 23/3735* (2013.01); *H01L 23/49827* (2013.01); *H01L 23/49833* (2013.01); *H01L 2224/16225* (2013.01); *H01L 2224/73253* (2013.01); *H01L 2924/0002* (2013.01);
(Continued)

(58) Field of Classification Search
CPC ............ H01L 2924/1517; H01L 2924/15174; H01L 23/49822; H01L 23/5385; H01L 23/5383; H01L 23/50; H01L 23/528; H01L 25/0657; H01L 25/50; H01L 25/0652; H01L 24/97; H01L 24/83; H01L 2224/83; H01L 21/4857; H01L 27/0207; H05K 2201/096; H05K 2201/0376; H05K 2201/09763; H05K 2201/09063; H05K 2201/09672; H05K 2201/09018; H05K 1/183; H05K 1/0298; H05K 1/0207; H05K 1/189; H05K 1/0284; H05K 1/144; H05K 3/4644; H05K 3/4623; H05K 3/4641; H05K 3/4611; H05K 3/4688; H05K 3/46; H05K 3/36; H05K 2203/1469; H05K 2203/061
See application file for complete search history.

(56) References Cited

U.S. PATENT DOCUMENTS 6,501,166 B2 12/2002 Wood et al.
8,427,833 B2 4/2013 Barowski et al.
(Continued)

FOREIGN PATENT DOCUMENTS

JP 2009071287 A 4/2009

*Primary Examiner* — Chuong A Luu
*Assistant Examiner* — Cory Eskridge
(74) *Attorney, Agent, or Firm* — Matthew C. Zehrer (57) ABSTRACT

A substrate device for electronic circuits or devices includes a first substrate section including a first plurality of layers attached to each other having a first orientation (x2) and a second substrate section including a second plurality of layers attached to each other. The second plurality of layers have a second orientation (x3). The first orientation (x2) and the second orientation (x3) are angled (α) with respect to one another.

12 Claims, 7 Drawing Sheets

(51) Int. Cl.
  *H05K 3/34* (2006.01)
  *H05K 3/40* (2006.01)
  *H01L 23/498* (2006.01)

(52) U.S. Cl.
  CPC ........... *H05K1/0298* (2013.01); *H05K 3/3436* (2013.01); *H05K 3/4046* (2013.01); *H05K 2201/048* (2013.01); *Y10T 29/49126* (2015.01)

(56) References Cited

U.S. PATENT DOCUMENTS

2007/0045815 A1\* 3/2007 Urashima ............ H05K 1/0231
  257/698
2009/0283312 A1\* 11/2009 Takahashi ............... H01L 24/24
  174/260

\* cited by examiner

SUBSTRATE DEVICE AND ELECTRIC CIRCUIT ARRANGEMENT HAVING FIRST SUBSTRATE SECTION PERPENDICULAR TO SECOND SUBSTRATE SECTION

FIELD

This disclosure generally relates to substrate devices for electronic circuits or devices and to a compound substrate having laminated layers. More particularly, printed circuit boards (PCB) and three-dimensional (3D) chip stacks are disclosed. The disclosed substrate devices can carry integrated circuit chips and serve for power delivery and thermal dissipation to and from the chip. Further, a 3D integrated chip stack package or flip-chip stack is disclosed. Further, a method for manufacturing substrate devices for electronic circuits or devices and for electric circuit arrangements is disclosed.

BACKGROUND

Printed circuit boards serve as substrates to provide power and signal communication to and from electronic circuits or devices placed on the printed circuit board. In high performance computing applications, a high packaging density is desired to improve computational performance and the energy efficiency of such systems. However, an increased power density may result in additional requirements, as for example, an efficient cooling infrastructure. E.g. a high packaging density of electronic components also requires relatively large metal contacts to minimize a voltage drop when electric current is fed to the components. Further, high signal bandwidth to and from highly packaged integrated circuits placed on a PCB may be necessary. In conventional laminated PCBs, structured copper planes are arranged in parallel to one another separated by resin or insulator layers. A vertical connection between copper planes may be made by round through vias that usually limit the number of wires across a PCB. Hence, conventional wire solutions may limit the signal bandwidth across a PCB board and may limit the power delivery to the chip on the board. In conventional arrangements, the cooling of an integrated chip placed on a PCB may be achieved by placing a cold plate on the upper side distal from the PCB on the integrated circuit. When moving from single chip to 3D-chip stacks, even more critical requirements with respect to bandwidth, power delivery and heat transfer or cooling are expected.

SUMMARY

It is therefore desirable to obtain improved substrates for integrated circuits allowing an efficient wiring for signal and power transfer, as well as thermal dissipation.

According to an embodiment of a first aspect of the invention, a substrate device for electronic circuits or devices includes at least one first substrate section including a first plurality of layers attached to each other and at least one second substrate section including a second plurality of layers attached to each other. The first plurality of layers includes a first orientation which is parallel to planes associated with the layers of the first plurality of layers and the second plurality of layers has a second orientation which is parallel to planes associated with the layers of the second plurality of layers. The first orientation and the second orientation are angled with respect to one another.

A substrate device according to embodiments is in particular suitable for implementing further electronic circuit arrangements or modules. According to embodiments the substrate device can be considered as a compound substrate or a composite substrate, in particular as a substrate device suitable to implement a printed circuit board. The layers may be, for example, laminated or bonded to each other.

The at least two substrate sections may each comprise insulating layers separating conducting layers that are manufactured according to conventional production processes, e.g. laminating or bonding. For example, the layers of a respective substrate section are generally arranged in parallel to each other, thereby forming planes. One may, for example, refer to a plane orientation in terms of a normal direction of a plane or a tangential direction of a plane. It is understood that the first orientation and the second orientation are angled, tilted or inclined with respect to each other, i.e. there is a non-vanishing angle enclosed between the layers or planes of different substrate sections.

In embodiments, the first orientation and the second orientation are essentially perpendicular to each other. For example, the first plurality of layers is essentially normal to the second plurality of layers. For example, the first substrate section can be a PCB or part of a printed circuit board structure, and the second substrate section is an insert with planes running across the first substrate section. As a result, signals or energy transferred by the first substrate section runs in a different direction with respect to the second substrate section. In particular, the second substrate section can be used for power delivery and heat removal in terms of thermally and electrically conducting layers that run vertically whereas the first substrate section layers run horizontally and may predominantly comprises plain signal circuitry. Embodiments of the proposed substrate device may allow for efficient energy transfer across and through the layers of the first substrate section in terms of the layers of the second substrate section.

In embodiments of the substrate device, the first and/or the second substrate section comprise a via for electrically coupling at least two layers of the respective plurality of layers. For example, vias may be used to couple layers of one laminated structure across different layers. In principle, vias can be used for power and/or signaling over electrically conducting layers in the laminates.

Embodiments may further comprise a third substrate section including a plurality of layers laminated or bonded to each other, the plurality of layers having a third orientation wherein the first orientation and the third orientation are essentially equal. One may contemplate a substrate device where the second substrate section is embedded in the first substrate section and covered by a third substrate section. The third substrate section can serve as an additional signal or power distribution plane when an electronic circuit or device is attached to the third substrate section. The first substrate section, the second substrate section and/or the third substrate section may each be part of a laminated substrate, wherein the laminated substrate comprises laminated layers alternating having a metal material and an insulating material. A metal material is in particularly electrically and thermally conducting, while the insulating material serves as basis structure and provides, e.g. structural integrity to the laminated structure. One may also refer to a compound structure. By having different orientations or laminated structures or substrates integrated into one substrate device an improved mechanical stability or rigidity can be achieved in addition to specific wiring geometries. The change in the laminate's orientation can make the substrate less vulnerable to warping.

In embodiments of the substrate device, electric coupling elements are providing for electrically coupling a first layer comprising the metal material with the second layer comprising the second material. The first layer can be part of the first substrate section, and the second layer can be part of the second substrate section. In particular, electrical coupling elements can be used for feeding electric energy or current into the optionally structured or patterned metal layers of the second substrate section.

In embodiments, the substrate device may comprise a bent or flexible laminated substrate, and the first and second substrate sections are parts of the same laminated structure.

In embodiments, at least one of the metal layers is patterned for forming an electric wiring of circuits in the associated plane of the plurality of layers. The metal layers are bonded between isolating layers and may form a printed circuit board wherein additional layers, for example in terms of a power insert, run across or perpendicular to the first substrate section.

In embodiments, the first substrate section has a thickness perpendicular to the first orientation, and the second substrate section has a height along the second orientation. In embodiments, a height is particularly less or equal to the thickness. For example, a second substrate section can be regarded as a power insert into an opening of an extended first substrate section. The second substrate section can be fixed within the opening of the first substrate section. One can also form an "opening" in a first substrate environment by attaching two or more specially shaped laminates together that form a hole or void region.

In embodiments, the substrate device has a first and a second surface wherein a first surface of the first substrate section coincides with the first surface of the substrate device. Edges of the second substrate section can reach or touch the first surface, e.g. edges of the second substrate section protrude towards or across the first surface of the first substrate section.

When the substrate device has a first and a second surface, at least one of the layers of the second substrate section can be implemented to thermally and/or electrically couple the first surface with the second surface. In particular, by the thermal coupling of different sides of the substrate device through the second substrate section, which can be arranged perpendicular to the first substrate section, an efficient cooling can be achieved. For example, the substrate device allows cooling from both sides of the substrate device. This is because the thermally or electrically conducting layers of the second substrate device provide for an efficient heat transfer. Further, an efficient signal and electrical power feed can be achieved. This is because a smaller voltage drop occurs when current runs across the electrically conducting planes of the second substrate section. Extended electrical conducting planes are more efficient than soldered throughholes or plated vias. Hence, in embodiments of the substrate device, the second substrate section is implemented to transfer thermal and/or electrical energy or power across the first substrate section perpendicular to the planes associated with layers of the first plurality of layers.

According to an embodiment of another aspect an electric circuit arrangement is provided comprising a substrate device as disclosed herein and an integrated circuit device arranged on a first surface of a substrate device. The second substrate section is, for example, adapted to transfer heat from the integrated circuit device across the first substrate section and/or to feed an electric current to the integrated circuit device.

In embodiments, the first substrate section is at least partially arranged below a peripheral area of the integrated circuit device. The integrated circuit device can have a central area, in particular suitable for receiving electrical energy and an outer peripheral area for signaling purposes. As the second substrate section is in particular suitable for carrying and transferring electrical or thermal energy, the second substrate section is preferably arranged below a region or zone of the integrated circuit chip, where higher power dissipation or heat flux with respect to other regions or zones occurs. One may also employ a plurality of second substrate sections that are positioned below high-power dissipation zones of the electric circuit or device. In some embodiments the specified high-power dissipation zone is a central region of a chip.

In embodiments, the second substrate section is at least partially arranged in a shadow area below the integrated circuit device. The shadow area is a region that is covered by the integrated circuit device when placed onto the first surface of the substrate device. The electrical circuit arrangement can comprise a solder ball array between the substrate device and the integrated circuit device. A solder ball array is an efficient device for contacting contact pads or terminal of the integrated circuit device. One may additionally use a land grid array (LGA) to couple the substrate device and a separate PCB.

In embodiments, at least one cooling device is thermally coupled to the integrated circuit device across the substrate section. Optionally or additionally, another cooling device can be coupled directly to the integrated circuit device. Hence, the arrangement allows for an efficient double cooling infrastructure for highly integrated and packaged devices on PCB boards.

In embodiments, the electric circuit arrangement is a flip-chip stack. The substrate structure may include fiberreinforced laminated materials. Fibers can enhance the rigidity and stability of the device.

In another embodiment of the invention a method for manufacturing a substrate device for electronic circuits or devices as mentioned herein is disclosed. The method includes providing a first substrate section having a first plurality of layers attached to each other, wherein the first plurality of layers has a first orientation which is parallel to planes associated with the layers of the first plurality of layers; forming an opening in the first substrate section; inserting a second substrate section having a second plurality of layers attached to each other, wherein the second plurality of layers has a second orientation which is parallel to planes associated with the layers of the second plurality of layers such that the first orientation and the orientation are angled with respect to one another.

For example, forming the opening in the first substrate section can comprise milling or grinding processes. One can also contemplate of laser cutting or other mechanical processes to form a specific void or volume in the first laminated structure. An opening can be formed by using pre-cut sheets or foils as the layers of the substrate materials, and attaching the sheets to each other as to obtain a void region surrounded by the first substrate section. One may refer to an opening as a hole, void region, volume, recess, cutout or the like. Inserting the second substrate section can comprise fixing the insert of the second substrate section with the first substrate section. Inserting can also include a process of laminating. E.g. a prefabricated first substrate section having attached layers, and a second substrate section having attached layers is placed in the opening first, and second temperature and/or pressure is applied to initiate a bonding and/or lamination process.

Hence, in embodiments of the method at least one of the stages of: fixing the inserted second substrate section; gluing the inserted second substrate section; applying heat for at least partially melting predetermined layers of the first and/or second substrate section; applying pressure for at least partially deforming predetermined layers of the first and/or second substrate section; compressing predetermined layers of the first and/or second substrate section; providing a prefabricated laminate device for forming the first and/or the second substrate section, wherein the prefabricates laminate device comprises a semi-polymerized synthetic material is included.

The method may include the stage of at least partially plating walls of the opening with a plating material. The plating material can comprise an electrically conducting material, as e.g. a metal like copper, silver, gold, plating or the like. Plating a structured metal layer on the side-wall can lead to additional electric coupling between metal layers of the first substrate section and the second substrate section.

The method may further comprise the stage of providing through vias in the first substrate section, and electrically coupling said through vias with the second substrate section. Providing through vias may comprise drilling, plating or filling processes. Forming or providing through vias can be executed before forming the opening or after inserting the second substrate section into the opening.

In embodiments of the method, the method comprises the stage of providing a patterned layer on the inserted second substrate section for adjusting protruding layer sections of the second substrate section to a predetermined pattern. For example, a patterned layer may comprise fine pitch lines compensating an inaccuracy of the position of the second substrate section in the opening of the first substrate section. The patterned layer can be used to adjust electric and thermal coupling to the pattern of reference pattern. The reference pattern can correspond to a solder ball array used in a chip stack or general electric circuit arrangement.

Certain embodiments of the presented substrate device and the electronic circuit arrangement or the method for manufacturing such may comprise individual or combined features or aspects as mentioned above or below with respect to exemplary embodiments.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings in which:

Like or functionally like elements in the drawings have been allotted the same reference characters, if not otherwise indicated. It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION

Throughout this disclosure, "plane orientation" or "layer orientation" refers to a two dimensional extension of an essentially flat region. The orientation can be given in terms of a normal vector extending perpendicular from the plane. The plane orientation, however, can also be described by two vectors lying in the plane.

Throughout this disclosure, cross-sections of three dimensional structures such as laminated substrates are shown. Arrows xi generally refer to a vector or direction lying in such a plane.

In this disclosure, it is sometimes referred to a horizontal plane and a vertical plane. Horizontal and vertical is to be understood relative to each other, and for reasons of simplicity it refers to the orientation of particularly planes or entities with respect to the drawings. It is understood that the term "horizontal plane" throughout this disclosures does not refer to a plane that is perpendicular to the gravity. Rather "horizontal" and "vertical" are meant to be orientations with respect to one another.

It is understood that the term "power signal" refers to an electric current or voltage coupled to an electric device to make it operable. In this disclosure the expression "signal" or "signalling" refers to electric signals that are adapted to convey information, e.g. a digital high or low level. It is understood that plain signals carry less power or energy than a "power signal". For example, a sensor signal or a monitoring signal is generally not implanted to provide electric energy to an electronic device. "Attached" layers are generally flat or extended regions of materials that are positioned next to each other. E.g. layers that are attached to each other can be identified separately by their interface or boundary surface. Attached does not necessarily mean that the materials are bonded to each other.

Figure 1:
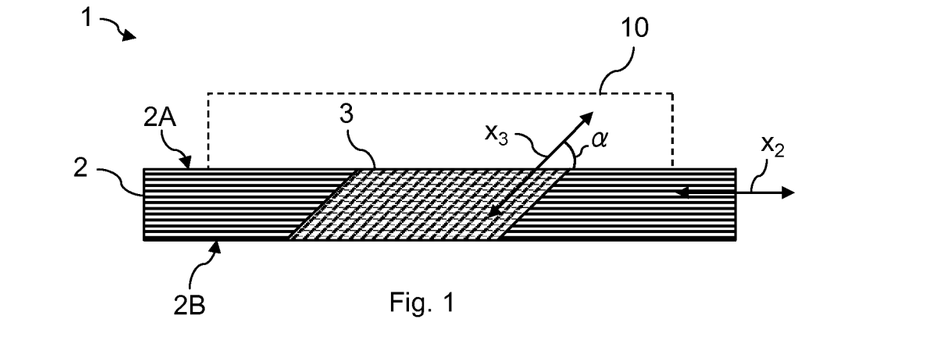
FIG. 1 shows a schematic diagram of an embodiment of a substrate device.

FIG. 1 shows a schematic diagram of a first embodiment of a substrate device. The substrate device 1 is shown in a cross-sectional view and comprises a first substrate section 2 and a second substrate section 3. The first and the second substrate sections 2, 3 comprise a plurality of layers that are laminated to each other. In particular, the structure resembles a printed circuit board wherein the second substrate section 3 is angled with respect to the surrounding first substrate section 2. On the upper surface 2A of the substrate section 2, an electronic circuit or device 10 can be placed. In FIG. 1, double arrows x2 and x3 refer to a plane orientation associated to the layers of the respective laminated structure or substrate section 2, 3. It is understood that the structure extends inside and outside the paper plane, such that x2 and x3 refer to vectors lying in the respective planes at the cross-section defined by the paper plane.

Figure 2:
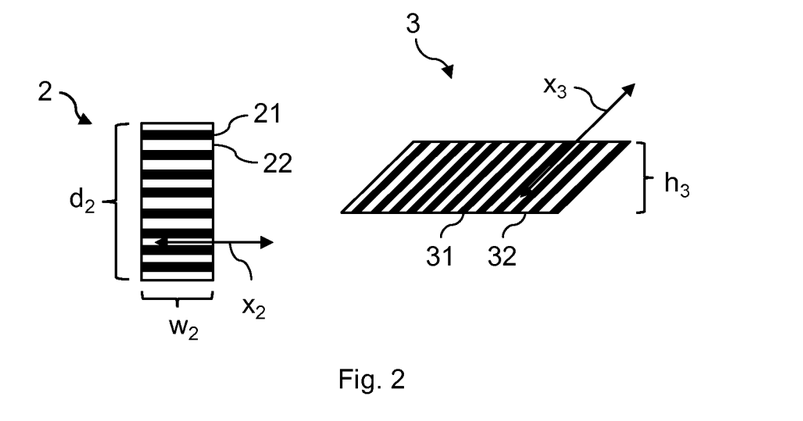
FIGS. 2 and 3 show schematic views of embodiments of substrate sections used in embodiments of substrate devices.

FIG. 2 shows embodiments of the substrate sections 2, 3 separately for clarity. Referring first to the first substrate section 2, a plurality of layers 21, 22 is shown. The layers are essentially flat and alternating comprise conducting and isolating materials. For example, metal layers 21 are implemented as copper layers separated and held by insulating or plastic layers 22. Substrate sections can be referred to as composite materials that achieve an improved strength and stability due to the bonding of the layers 21, 22. The substrate sections 2, 3 hence comprise sandwiched structured composites.

In FIG. 2, also an embodiment of the second substrate section 3 is shown. The second substrate section 3 has a similar appearance as the first substrate section 2, however with respect to the plane orientation x2, the laminated layers 31, 32 are angled. This is illustrated in FIG. 1 referring to the angle α. The second substrate section 3 may be regarded an insert which is embedded into or surrounded by the first substrate section 2. The second substrate section 3 is built by alternating electrically conducting or metal layers 31 and insulating layers 32.

In FIG. 2, a thickness d2 of the first substrate section 2 and a width w2 of the first substrate section 3 is also shown. Due to the tilted or inclined planes associated to the layers 31, 32 of the second substrate section 3, a height h3 is lower than the internal length from the bottom side to the top side along the planes. In the combined view of FIG. 1, d2 equals h3. In the orientation of FIG. 1, the tilted arrangement of layers or the angled arrangement and combination of laminated structures, i.e. the first and the second substrate sections 2, 3, allow for a heat and electric energy transfer from the lower to the upper side and vice versa. In particular embodiments, the angle α is 90°, i.e. both laminated structures 2, 3 are perpendicular to each other.

Figure 3:
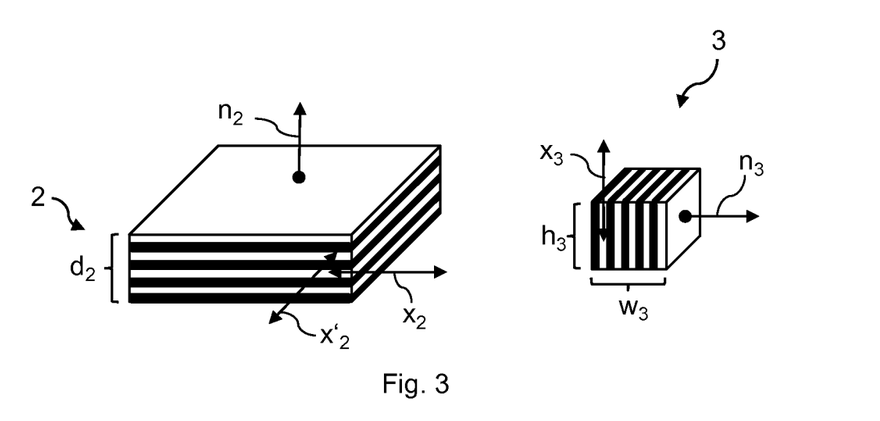

FIG. 3 shows another embodiment of substrate sections that can be used in embodiments of substrate devices. FIG. 3 shows an extended first substrate section 2 having a thickness d2 and a plane orientation indicated double arrows x2 and x2' respectively. Alternatively, one can use the normal vector n2 to define a plane orientation. As explained with respect to FIGS. 1 and 2, the plane orientation refers to the essentially parallel arranged laminate layers that are indicated in black and white in FIG. 3. A suitable insert as a second substrate section 3 is also shown in FIG. 3 having a width w3 and a height h3. The plane orientation of the laminated layers is indicated as double arrow x3 and alternatively in terms of the normal vector n3. In this perpendicular arrangement, the normal vectors n2 and n3 enclose a right angle, i.e. 90°. The planes formed by the isolating and conducting layers of the laminates 2, 3 are perpendicular to each other.

One can contemplate other manufacturing methods for the layered substrate sections. One can grow or deposit the materials of the layers on one another. The substrate sections can also be manufactured by electroplating, using a photoresist mask as a dielectric layer. In some embodiments foils are used as a layer material. Printing techniques can also be contemplated. The metal layers are preferably structured or patterned for generating an electric circuit or a wiring.

Figure 4:
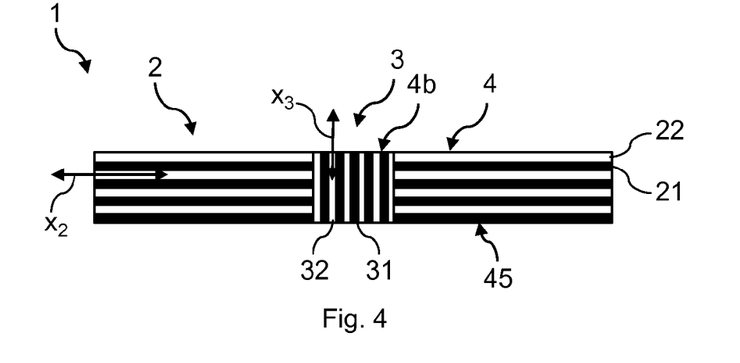
FIG. 4 shows a schematic diagram of an embodiment of a substrate device.

A second embodiment of a substrate device in terms of a schematic cross-sectional diagram is shown in FIG. 4. The substrate device 1 comprises a first substrate section 2 with horizontal laminated layers 21, 22 with a perpendicular insert 3. The inserted substrate section 3 has vertical laminated layers 31, 32. The plane orientation is indicated by the arrows x2 and x3. One can speak of an insert 3 embedded in a horizontal laminate 2. The entire substrate device can be part of a printed circuit board PCB.

In FIG. 4, an upper surface 4 and a lower surface or bottom surface 45 are indicated. In particular, the electrically conducting layers 31 of the insert substrate section 3 allow for a thermal coupling across the thickness of the first substrate section 2. It is in particular an advantage over conventional structures implementing a vertical electric energy transfer in terms of vias and electrically pleated through-holes between horizontal layers.

Figure 5:
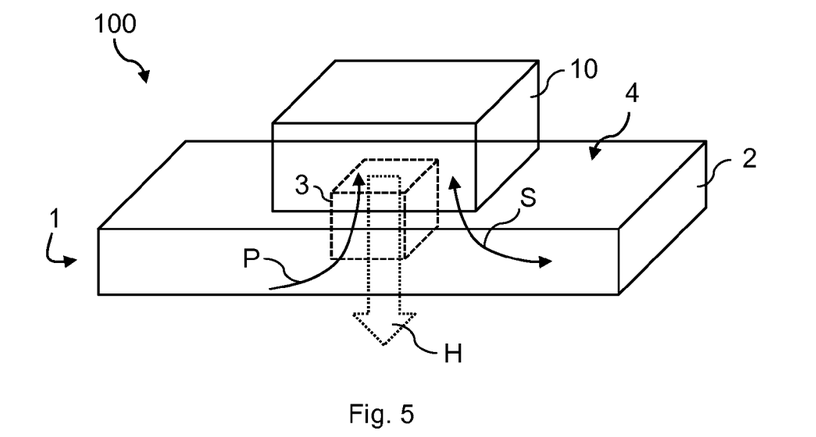
FIG. 5 shows a schematic diagram of an embodiment of an electronic circuit arrangement including an embodiment of a substrate device.

A schematic diagram of an embodiment of an electronic circuit arrangement 100 including the embodiment of a substrate device according to FIG. 4 is shown in FIG. 5. The substrate device 1 is indicated similar to a PCB board. The substrate device 1 has the first substrate section 2 with horizontal layers and an insert 3 with vertically arranged layers. An electric circuit, die or an integrated circuit device 10 is placed on the top surface 4 of the substrate device 1. With appropriate coupling means, the electronic device 10 is attached to the conducting and potentially structured layers of the laminates. The vertical arrangement of layers allows an efficient heat and electric current transfer which may lead to a good cooling or heat dissipation from the integrated circuit 10 through the substrate device 1. This is indicated as the arrow H in FIG. 5. If the integrated circuit 10 is not covered or stacked with other circuits, heat can dissipate upwards and downwards in the orientation of FIG. 5.

The vertical conducting layers of the insert 3 further allow for an efficient power or current delivery to the electronic circuit 10. For example, electronic signals S that are less energy-intensive are coupled to and from the electric device 10 by conventional means in terms of vias or through-holes in the first substrate section below the periphery of the integrated circuit 10. High power signals, such as supply currents are fed into the electric device 10 through the insert in a central region.

Figure 6:
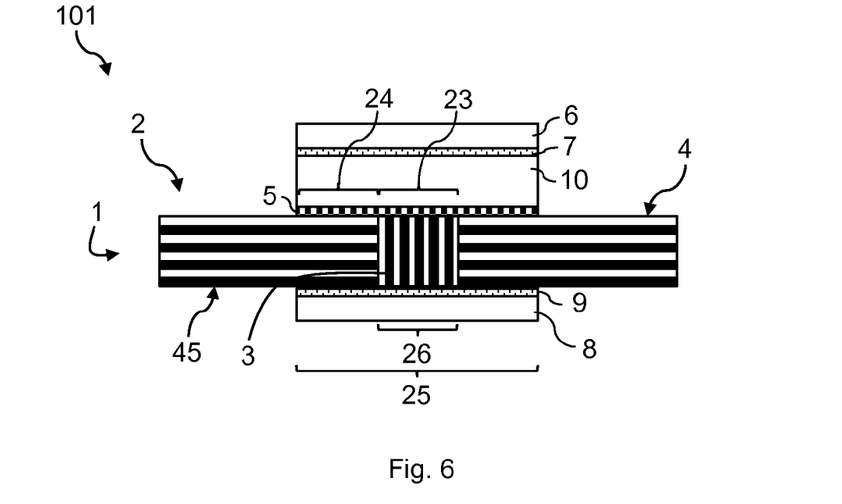
FIG. 6 shows a schematic diagram of an embodiment of an electronic circuit arrangement including an embodiment of a substrate device.

FIG. 6 shows a schematic diagram of an embodiment of an electronic circuit device including the embodiment of a substrate device shown in FIG. 4. The electronic circuit arrangement 101 comprises the substrate device 1 where the outer first substrate section 2 has horizontal planes or layers, and the insert substrate section 3 or second substrate section 3 has vertical layers or laminates. An integrated circuit or a die or stack 10 is coupled to a substrate device 1 that serves as a printed circuit board with a coupling arrangement 5. The coupling arrangement 5 can comprise pads, solder balls, land grid arrays or other means to electrically couple terminals or contacts of the die or chip stack 10. The substrate device 1 can be considered as a carrier board for the electric device 10. Additional terminals or contacts attached to the substrate device 1 are not explicitly shown in FIG. 6. In particular, the vertical e.g. copper planes allow for a vertical heat transfer and a vertical power delivery towards the chip or die 10. Thermal energy is produced when operating the chip 10 is dissipated upwards and downwards in FIG. 2. There is an upper cooling plate 6, for example a dissipation device attached to the die or chip 10. This is achieved by a thermally conducting layer 7 that may comprise a specific paste or material. On the bottom side, a second cooling device 8, e.g. a cold plate, is attached to the bottom side 45 of the substrate device 1. A thermal coupling 9 is indicated in FIG. 6 between the lower surface 45 and the second cold plate 8.

Hence, in the arrangement shown in FIG. 6, thermal energy can dissipate to both sides of the PCB or substrate device 1. In the orientation of FIG. 6, the integrated circuit or die 10 has a central region 23 and a peripheral region 24. The central region 23 is for example used to receive electric power in terms of currents from the second substrate section 3 that can be referred to as a "power insert". The second substrate section is preferably situated below or close to the region or zone where an enhanced power dissipation from the die or circuit device 10 takes place. A peripheral region 24 of the chip or die 10 may have dedicated terminals for (plain) signals. As signals usually are less power-intensive, conventional couplings to the horizontal conducting layers of the first substrate section 2 can be used. The region below the chip 10 placed on the substrate device 1 is sometimes referred to as a shadow region 25. The region below the central region 23 of the chip or die 10 where preferably the power insert 3 is situated can be referred to as a core shadow region 26. The arrangement 101 allows for a compact cooling infrastructure and an improved packaging density of the dies. As a result, the embodiment can handle higher power densities due to the efficient vertical energy and power transport through the power insert 3.

The die or IC 10 can be, for example, an integrated memory stack. However, one can also contemplate of multi-core processing units or other electronic devices. The circuit arrangement 101 is for example suitable for server modules and the like. The thermal resistance of the vertically arranged planes in the power insert 3 is generally lower than across the horizontally arranged layers of the first substrate section 2. Thermal transport through the vertically arranged conducting layers is also better than through vias that may be filled with solder material.

Figure 7:
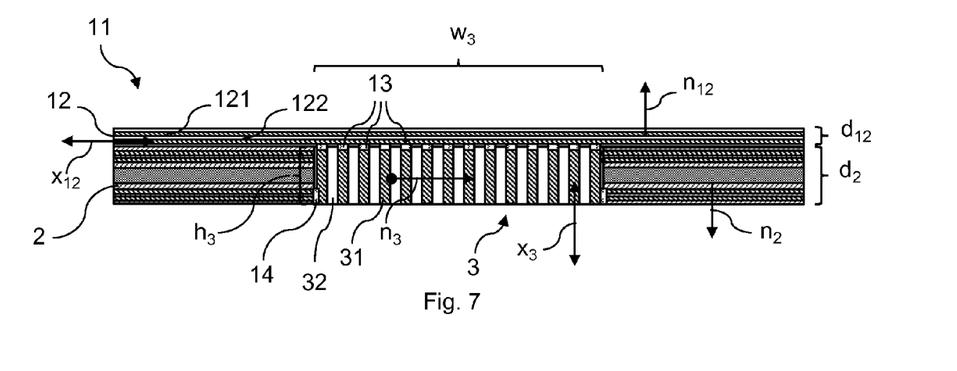
FIG. 7 shows a schematic diagram of an embodiment of a substrate device.

FIG. 7 shows a schematic diagram of an embodiment of a substrate device. The substrate device 11 comprises a first substrate section 2 of horizontally arranged laminated or bonded layers. The layers are, for example, alternating metal copper layers and insulating or plastic layers. The resulting planes have an orientation which is depicted in terms of normal vector n2. The thickness d2 of the first substrate section 2 is indicated in FIG. 7 as well. A power insert or second substrate section 3 with a vertical conducting plane 31 is embedded in an opening of the first substrate section 2. The second substrate section 3 comprises alternating thermally and electrically conducting layers 31 and insulating layers 32. Although FIG. 7 shows a cross-section, a normal vector that coincides with a paper plane n3 is shown for illustrating the layer or plane orientation. The height h3 of the power insert 3 is equal or at least similar to the thickness d2.

A third substrate section 12 is placed on the top surface of the compound 2, 3. The third substrate section 12 comprises horizontal planes or layers of alternating metal and insulating layers 121, 122. The plane or layer orientation is indicated as the normal vector n12. There are provided electric coupling elements 13, 14 that connect in particular metal or copper planes of the different substrate sections 2, 3, 12 together. It is understood that the copper or metal planes 31, 21 and 121 can be structured and patterned for realizing electric circuits in those planes.

When inserting the second substrate section 3, the upper edges of the vertical metal planes or layers may not accurately correspond to references positions according to specific reference patterns of the used chips, e.g. solder ball arrays can be used to couple to dies or integrated circuits. Respective pitch compensation may be achieved through the third structured substrate section 12. The substrate section 12 can be laminated or bonded on the upper surface of the compound or composite comprising the first and second substrate sections 2, 3. In some embodiments the reference pattern is defined by copper pillars used to electrically couple the die or chip with the substrate device.

In embodiments, the width w3 of the second substrate section 3 can be, for example, between 1 and 20 mm. In some embodiments, the width w3 is between 0.5 and 15 mm. A thickness d2 or height h3 is, for example, between 1 and 2 mm. d2 and h3 can also range between 1.4 and 1.8 mm. The upper or third substrate section 12 can have a thickness of d12 between 0.04 and 0.3 mm. However, other ranges of thicknesses or widths can be contemplated.

In particular a copper foil is used as metal layers in the laminates. E.g. a metal layer based on copper foil has a thickness of at least 15 µm, in some embodiments at least 22 µm.

Generally it is an advantage to implement thicker metal layers in the second substrate section than in the first substrate section. Preferred embodiments have metal layer thicknesses between 75 and 400 µm. Even more preferably, the thickness is between 75 and 150 µm. The dielectric layer is, for example, between 25-40 µm thick.

Compared to conventional approaches for substrate devices where a single layer or plane orientation is used the embodiments shown employ multiple vertical layered structures for power and heat delivery and dissipation. Conventionally, through holes or vias that are covered with a metal are used for a vertical energy transport in a horizontally arranged laminate. In the embodiments disclosed herein, vertical metal layers are used that generally reach larger thicknesses than relatively thin metal platings in vias. The embodiments having vertical metal layers are therefore more efficient for current and heat transfer to and from a die or chip than vias used in conventional substrates.

Figure 8:
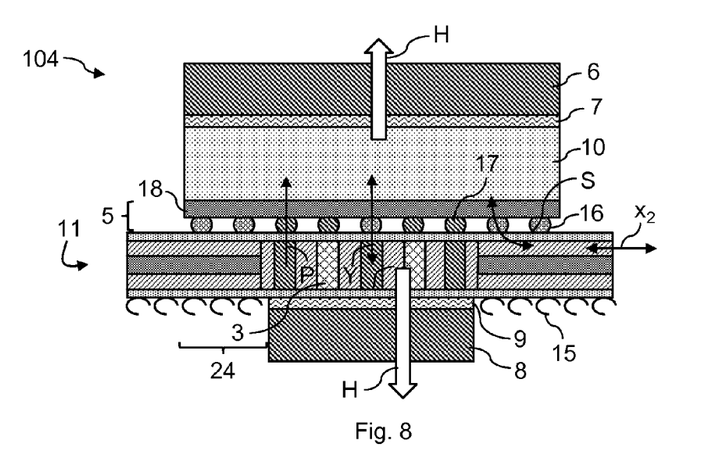
FIGS. 8 and 9 show schematic views of an embodiment of an electronic circuit arrangement.
Figure 9:
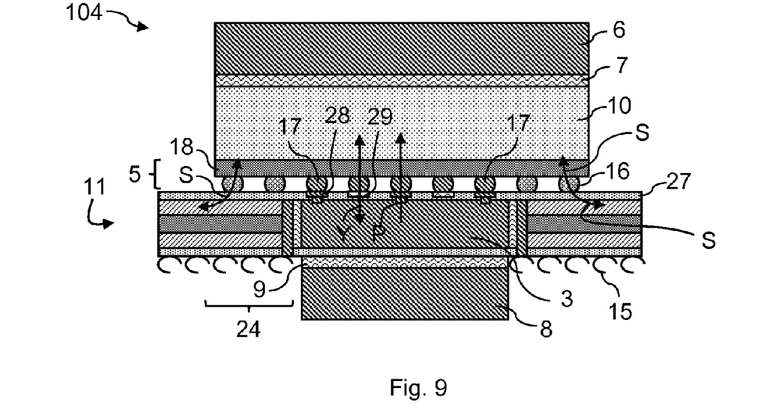

FIGS. 8 and 9 show schematic views of an embodiment of an electronic circuit arrangement. FIG. 8 shows a front view and FIG. 9 shows a side view (in a crosssectional view). The electronic circuit arrangement 104 includes a substrate device 11 similar to the embodiment shown in FIG. 7. The substrate device 11 includes the central power insert 3 which is not explicitly provided with further reference signs for the layers. The power insert 3 is situated below the central area of the above arranged die or stack 10. The substrate device 11 can be combined with a printed circuit board with a spring array 15 coupled to further modules (not shown). The upper layer 27 of the substrate device 11 comprises a patterned structure of horizontal layers. This is indicated in FIG. 9 as electric coupling elements 28, 29. The substrate device 104 is in particular suitable for electrically and mechanically coupling with a mating socket in or on a PCB having the spring array 15.

The die or stack 10 is coupled to the substrate device 11 with contact pads 18 and solder balls 16, 17. The peripheral solder balls 16 are coupled to signal lines in the horizontal structured metal layers of the substrate device 11. This is indicated by the arrows S. In the central area, electrical power is fed into the die or stack 10 by the vertical metal planes of the power insert 3. A pitch or misalignment between the ball grid array or other terminals of the stack or contacts is compensated for through the electric coupling elements 28 and 29.

In order to dissipate heat generated by the stack or chip 10 in particular where the electric power is delivered to chip 10, an upper cold plate 6 and a lower cold plate 8 are attached to the system. The upper cold plate 6 is placed on the die 10 with a thermal coupling paste 7. The lower cold plate 8 is also thermally coupled to the power insert 3 through an appropriate thermal coupling paste 9. The electric power or energy provided to the die 10 is indicated by the arrow P that runs through the vertical layers, e.g. copper layers, of the power insert 3. Additionally or optionally, also sensing signals, wires or additional wiring, can be realized in high density by the closely packed vertical and structured metal layers of the power insert 3. Respective complimentary signals are sometimes called pervasives or pervasive signals. Although not explicitly shown in the Figures, conventional vias can be used to couple various metal layers in the substrate 11.

Figure 10:
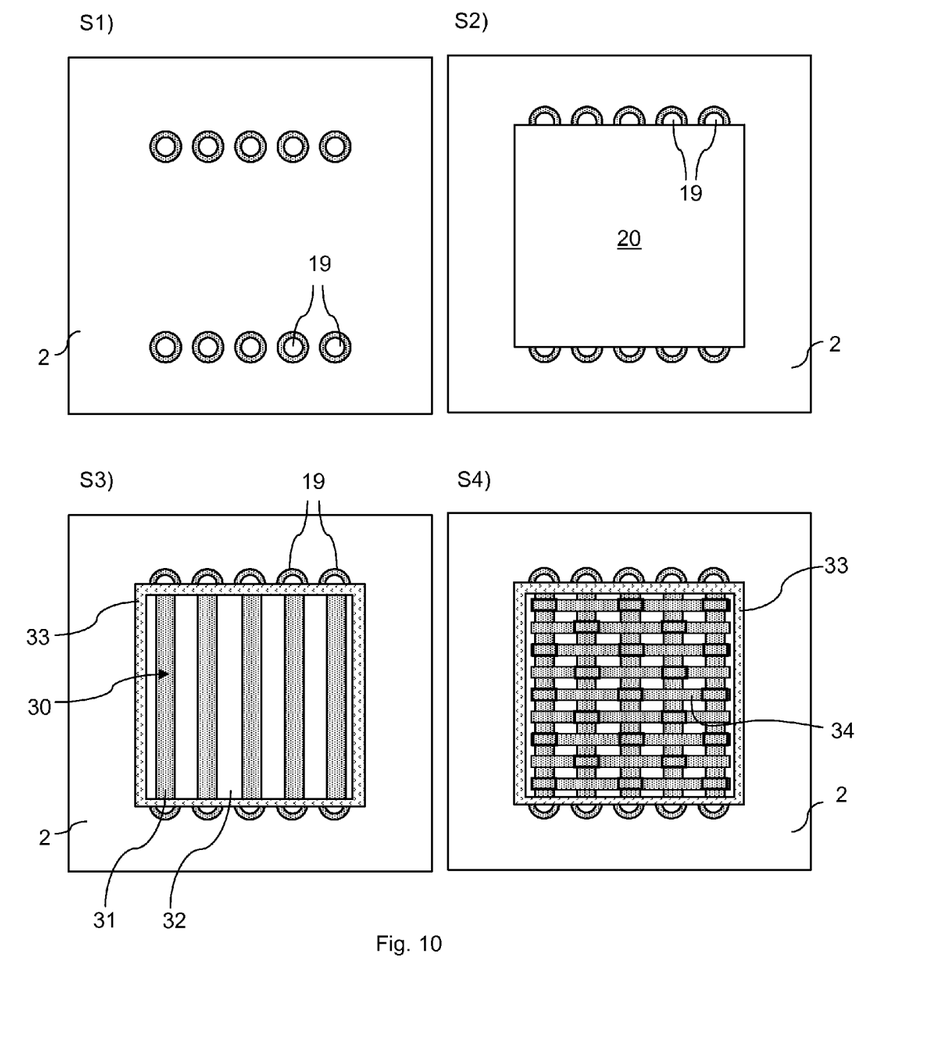
FIGS. 10-13 illustrate methods for manufacturing substrate devices and further embodiments of substrate devices.
Figure 11:
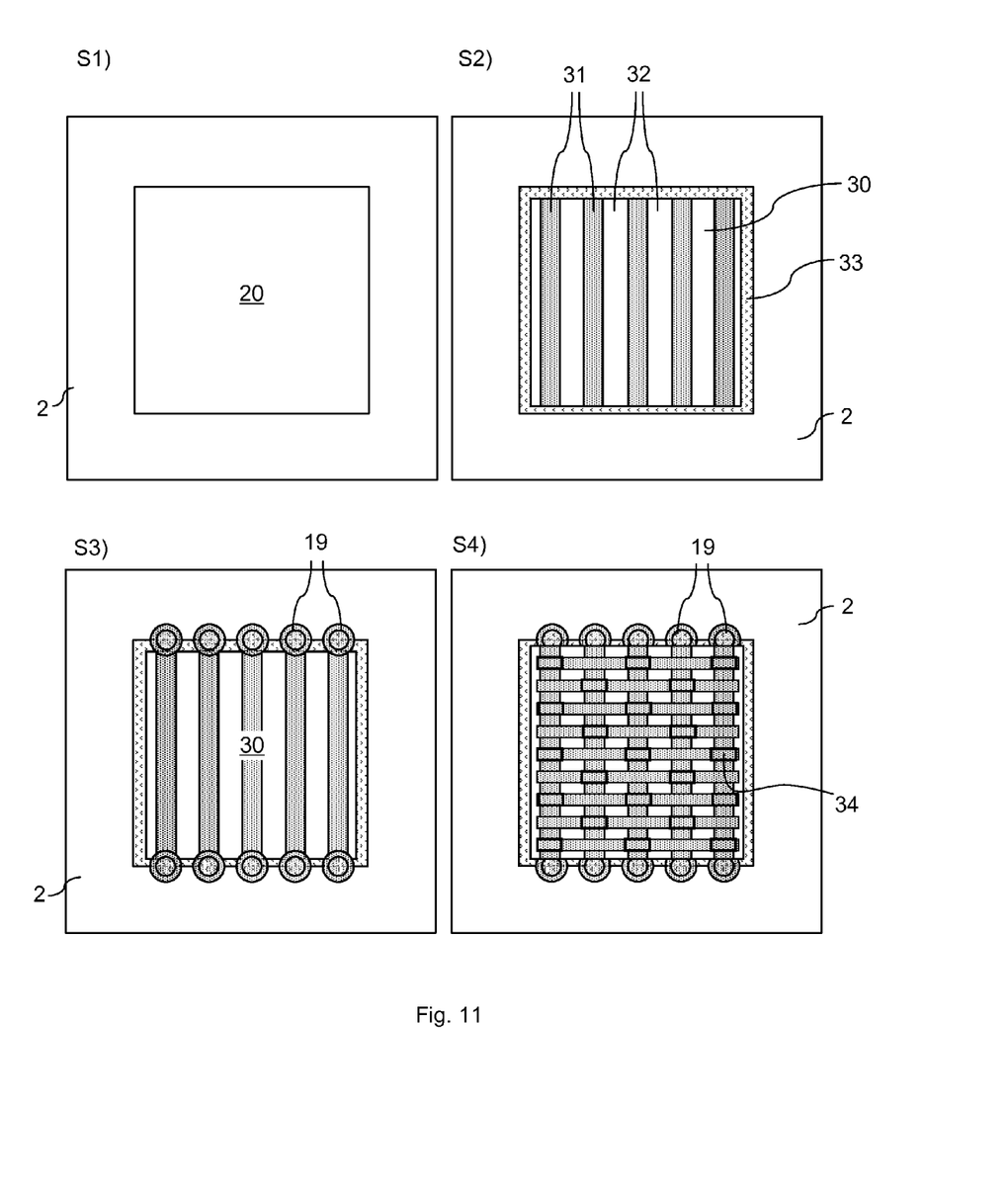

Next, FIGS. 10 and 11 illustrate fabrication method stages and embodiments of substrate devices involved in the production of a substrate device. First, referring to FIG. 10, in step S1 a pre-manufactured laminated substrate 2 is provided. The laminated substrate 2 can comprise alternating layers of metal and insulating material. One may use conventional PCB board material. As illustrated in stage S1, through vias are formed in the laminate perpendicularly to the planes. In FIG. 10, the vias extend into the paper plane. The vias 19 are also filled with solder to create vertical electrical connections.

In the next stage S2, an opening 20 is created in the first substrate section 2. The opening 20 can be milled or ground. One can also contemplate laser cutting or other techniques to create an opening or void region 20. Preferably, the vias are coupled along their length to the void or opening 20.

In the next stage S3, a prefabricated insert 30 having laminated conductive and insulating layers 31, 32 is placed into the void region or opening 20. Glue 33 can be inserted into the region between the insert and the walls of the cutout or opening. As shown in FIG. 10, the vias filled with solder 19 are coupled to the edges of the metal planes 31 of the insert 30. Next, an upper layer 34 is formed in stage S4. The structured metal layer 34 serves as a pitch adjustment with respect to a reference pattern given by the contacts of the flip chip or die placed onto the substrate device. The patterning of the upper layer(s) 34 is implemented to compensate for a tilt of the insert 30 due to inaccuracies when inserting and gluing it in the opening 20.

FIG. 11 shows another embodiment for fabricating or manufacturing a substrate device. In a first stage S1, a laminated substrate section 2 is provided and an opening 20 is formed. Next, in stage S2, a power insert 30 is placed into the opening and fixed with a glue, resin or epoxy 33. Next, in stage S3, through vias 19 are drilled at the edges of the metal layers of the power insert 30 into the paper plane. The vias 19 are plated with metal and/or filled with a polymer for stability reasons. Next, the upper layer compensating for an inaccuracy or tilt of the power insert 30 in the opening 20 is patterned and laminated on the upper surface in stage S4. Fine pitch lines 34 are only schematically drawn.

Referring to the steps of forming an opening one can pursue alternative or additional approaches. E.g. an opening can be formed by chemical processes, one can employ electro-erosion, plasma etching techniques or use prefabricated sheets with apertures that combine to an opening or recess when attached to each other.

Further, the walls of opening can be partially metalized for generating electric coupling means, e.g. a wiring for bridging horizontal metal planes of the first substrate section with vertical metal layers of the second substrate section that have a different pitch or that are shifted laterally. Generally, one can provide the side walls of the opening at least partially with a conductive plating.

A relatively thick metal plating of the opening's side walls can replace the use of vias or through holes. Vias need to be fabricated or drilled subject to specific ranges of their aspect ratio, depth, inclination with respect to the horizontal surface of the first substrate section and their precise position. In addition, plating the vias and filling the plated vias with a stabilizing resin requires further specifications. A plating or metallizing process of an essentially flat side wall of an opening is potentially easier to implement and yields higher aspect ratios when considering the ratio of the thickness of metal layer/vertical height as the aspect ratio. The aspect ratio of diameter of the via/vertical height of the insert and/or first substrate is generally lower.

Generally, the higher the aspect ratio of via the harder it is to provide a metal plating. As a result, a substrate device with a pitch adjusted contact pattern obtained. It is an advantage that the power insert or the second substrate section can be premanufactured and inserted into fabricated openings. One can also contemplate of several power inserts attached to each other to fill particularly large voids or openings.

Figure 12:
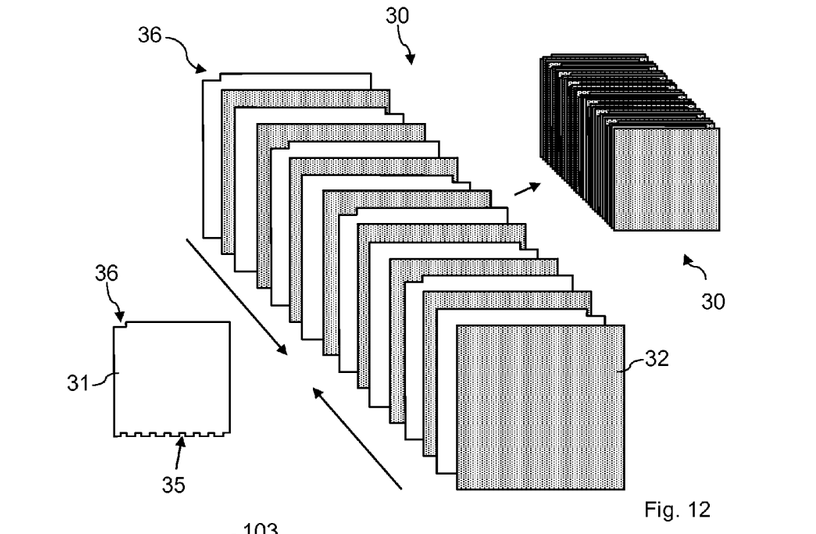
Figure 13:
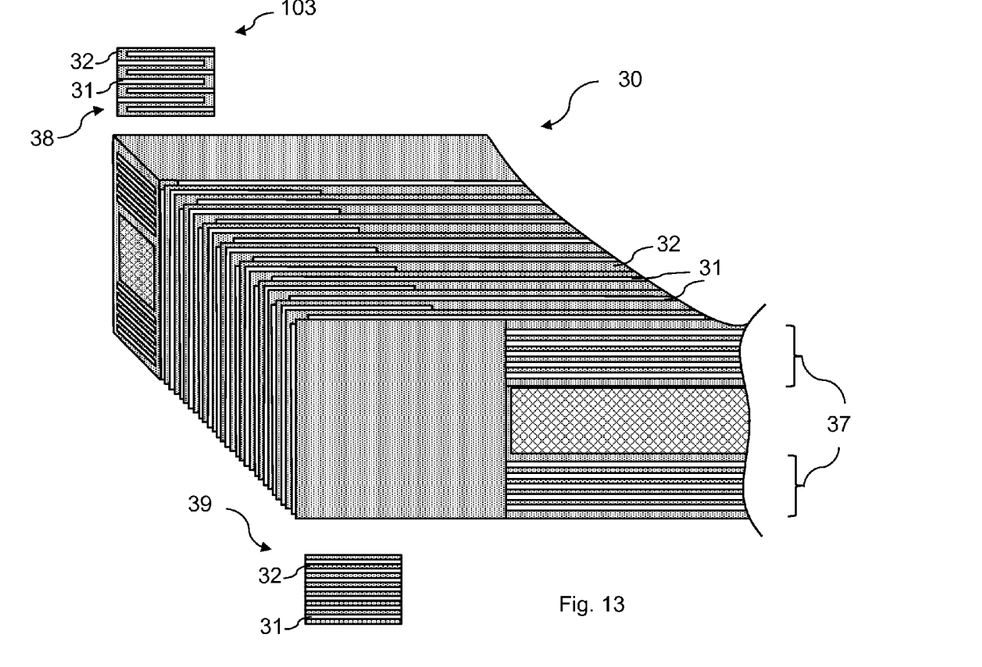

FIGS. 12 and 13 illustrate the fabrication of an embodiment of a power insert. The power insert 30 comprises a plurality of planes or layers 31, 32. The layers 31, 32 can be geometrically structured in order to achieve a desired wiring pattern when the insert is used and coupled to a flip-chip or the like.

FIG. 12 shows in an exploded view the resin or insulating layer 32 and metal layers 31. On the left, an exemplary metal layer design 31 is shown. The lower toothshaped structure corresponds to the regular pitch of a land grid array, i.e. the edges of the power insert 30 can be implemented to replicate the regular pitch or contact arrangement of the die or chip eventually used. One can customize the power insert 30 to the needs of the actual substrate device and the contact geometries. There is a cut-out corner 36 resulting in a staggered contact on the surface when the layers are laminated to each other. The resulting power insert 30 is illustrated in the upper right corner of FIG. 12.

FIG. 13 shows a power insert 30 having several sections. The dark regions show the raising or insulator and the light regions refer to the metal layers. In the left of FIG. 13, cross-sections or views onto the surfaces or edges of the power insert 30 are illustrated. For example, a regular pattern 39 having alternating metal and insulating layers 31, 32 is arranged (in the orientation of FIG. 13) at the lower right down-face of the power insert 30. One can also implement a comb-like structure illustrated in the upper left 38. The right-half structures are, for example, used for a particular, for example standard IO wiring. Generally, the insert can be flexibly arranged and patterned.

Figure 14:
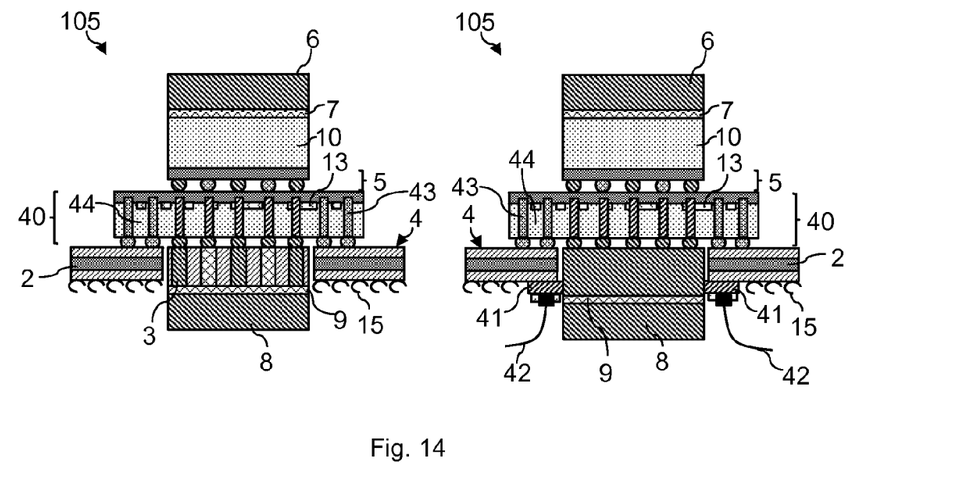
FIG. 14 shows a schematic diagram of an embodiment of an electronic circuit arrangement.

FIG. 14 shows a schematic diagram of an embodiment of an electronic circuit arrangement using a substrate device with a power insert. The left-hand side of FIG. 14 is a front view and the right-hand side is a side view. The configuration 105 shown in FIG. 14 is similar to the embodiment of an electronic circuit arrangement shown in FIGS. 8 and 9. Same elements are not explicitly referred to again. An interposing device 40 is arranged between a die or stack 10 and the surface 4 of the substrate device. The power insert 3 extends in its height, the thickness of the first substrate section. The power insert 3 protrudes downwardly the opening in the first substrate section 2. This is because laterally a power pad 41 with a wiring device 42 is arranged. The power pad 41 couples to the power insert 3 electrically. The interposing device 40 distributes the current supplied to the power pads 41 through the power insert 3 to the coupling arrangement 5 on the one hand, and on the other hand electric signals and sensing signals are coupled from the peripheral first substrate section 2 to terminals of the die or integrated circuit 10.

Electric power is fed to the power insert 3 from the lower side and less power intensive signaling is coupled between the horizontal first substrate section layers to the integrated circuit 10 from the upper side. The signal and power distribution is achieved by the interposing device 40. Electric coupling elements 44 may cater for a horizontal distribution of the signals, while vias 43 essentially carry signals vertically.

Figure 15:
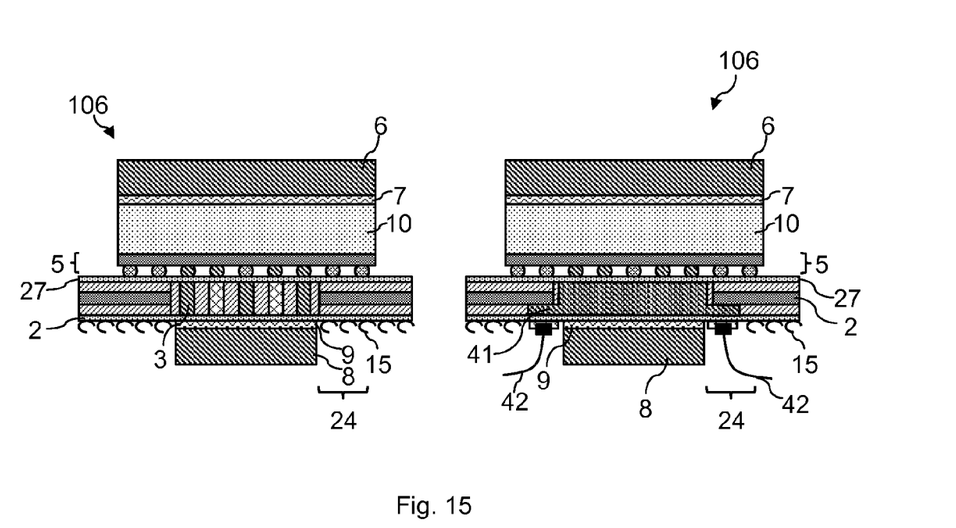
FIG. 15 shows a schematic diagram of an embodiment of an electronic circuit arrangement.

FIG. 15 is yet another embodiment of an electronic circuit arrangement 106. The left Figure shows a front sectional view and the right Figure a side sectional view of the circuit arrangement 106. The power insert 3 has a T-shape as can be seen on the right-hand side of FIG. 15. The power insert 3 extends into the horizontal layers of the first substrate section 2. The T parts of the power insert 3 have a same role as the power pads 41 illustrated in FIG. 14. Wiring devices 42 feed electrical energy to the power insert 3 that vertically carries the electrical power to the actual electric device 10.

It is an advantage that the T-shaped power insert 3 allows for a wiring in the peripheral region 24 below the chip 10. When manufacturing the substrate device involved in this electronic circuit arrangement 106, the upper layer 27 is laminated after the power insert is integrated into the substrate section 2. Through the lateral Tshaped extensions 41, the power supply to the chip 10 is better separated from signaling through the horizontal layers of the first substrate section.

Still, the arrangements shown in FIGS. 14 and 15 allow for a double-sided cooling. Instead of relying on thermal vias, the horizontal copper or metal layers in the power insert 3 allow for a thermal and electrical energy transfer to and from the chip attached to the respective substrate device. In comparison to vias with soldering, the copper or metal fill factor is higher in the embodiments disclosed herein. For example, in embodiments, the ratio between metal and insulating material in the power insert can be between 50% and 90%.

Hence, the thermal dissipation and thereby cooling efficiency of cold plates or other cooling devices attached to the arrangement is improved. The substrate devices allow for an improved thermal performance of 3D stacks with high power bottom dies. The laminate manufacture can be based on conventional lamination techniques. In summary, efficient measures to improve thermal dissipation from chip stacks and an efficient power delivery through laminated copper sheets perpendicular to the orientation of the conventional PCB board are achieved. The concept allows for high copper or metal content in the power inserts, thereby reducing thermal resistance.

In general terms, an embodiment provides a substrate device for electronic circuits or devices comprising: at least one first substrate section including a first plurality of layers attached to each other, the first plurality of layers having a first orientation which is parallel to planes associated with the layers of the first plurality of layers; at least one second substrate section including a second plurality of layers attached to each other, the second plurality of layers having a second orientation which is parallel to planes associated with the layers of the second plurality of layers; wherein the first orientation and the second orientation are angled/tilted/inclined with respect to one another.

In an embodiment, the first orientation and the second orientation are essentially perpendicular to each other. In an embodiment, the first and/or the second substrate section comprises a via for electrically coupling at least two layers of the respective plurality of layers.

In an embodiment, the substrate device further comprises a third substrate section including a plurality of layers attached to each other, the plurality of layers having a third orientation, wherein the first orientation an the third orientation are essentially equal.

In an embodiment, the first substrate section, the second substrate section and/or the third substrate section are each part of a laminated substrate, the laminated substrate having laminated layers alternating comprising a metal material and an insulating material.

In an embodiment, the substrate device further comprises electric coupling elements for electrically coupling a first layer comprising the metal material with a second layer comprising the metal material, wherein the first layer is part of the first substrate section and the second layer is part of the second substrate section.

In an embodiment, the second substrate section is embedded in the first substrate section. In an embodiment, the first and second substrate sections are parts of a bent substrate.

In an embodiment, at least one of the metal layers is patterned for forming an electric wiring or circuit in the associated plane.

In an embodiment, the first substrate section has a thickness perpendicular to the first orientation, and the second substrate section has a height along the second orientation, an wherein the height is less or equal than the thickness.

In an embodiment, the substrate device has a first and second surface, wherein a first surface of the first substrate section coincides with the first surface of the substrate device, and edges of the second substrate section reach the first surface.

In an embodiment, the substrate device has a first and second surface, wherein at least one of the layers of the second substrate section is implemented to thermally and/or electrically couple the first surface with the second surface.

In an embodiment, the second substrate section is implemented to transfer thermal and/or electrical energy or power across the first substrate section perpendicular to the planes associated with the layers of the first plurality of layers.

In an embodiment, the substrate device is part of a printed circuit board. A further embodiment provides an electric circuit arrangement comprising a substrate device as set out above, an integrated circuit device arranged on a first surface of the substrate device, wherein the second substrate section is adapted to transfer heat from the integrated circuit device across the first substrate section and/or to feed an electric current to the integrated circuit device.

In an embodiment, the first substrate section is at least partially arranged below a peripheral area of the integrated circuit device. In an embodiment, the second substrate section is at least partially arranged in a shadow area below the integrated circuit device. In an embodiment, the arrangement further comprises a solder ball array between the substrate device and the integrated circuit device. In an embodiment, the arrangement further comprises at least one cooling device that is thermally coupled to the integrated circuit device through the second substrate section. In an embodiment, the electric circuit arrangement is a chip-flip stack.

A further embodiment provides a method for manufacturing a substrate device for electronic circuits or devices, comprising: providing a first substrate section having a first plurality of layers attached to each other, wherein the first plurality of layers a first orientation which is parallel to planes associated with the layers of the first plurality of layers; forming an opening in the first substrate section; inserting a second substrate section having a second plurality of layers attached to each other, wherein the second plurality of layers has a second orientation which is parallel to planes associated with the layers of the second plurality of layers such that the first orientation and the second orientation are angled with respect to one another.

In an embodiment, the method further comprise: providing through vias in the first substrate section, and electrically coupling said through vias with the second substrate section. In an embodiment, the method further comprises: providing a patterned layer covering at least the inserted second substrate section for adjusting protruding layer sections of the second substrate section to a predetermined pattern.

The invention claimed is:

1. A substrate comprising:
   at least one first substrate section including a first plurality of layers attached to each other, the first plurality of layers having a first orientation which is parallel to planes associated with the first plurality of layers;
   at least one second substrate section including a second plurality of layers attached to each other, the second plurality of layers having a second orientation which is parallel to planes associated with the second plurality of layers;
   wherein the first orientation is perpendicular with respect to the second orientation.

2. The substrate device of claim 1, further comprising:
   a via that electrically coupling that electrically couples a layer of the first plurality of layers with a layer of the second plurality of layers.

3. The substrate device of claim 1, further comprising:
   a third substrate section including a plurality of layers attached to each other, the plurality of layers having a third orientation, wherein the first orientation and the third orientation are parallel.

4. The substrate device of claim 3, wherein the first substrate section, the second substrate section and the third substrate section comprise alternating laminated layers comprising a metal layer and an insulating layer.

5. The substrate device of claim 1, further comprising:
   electric coupling elements that couple a first layer comprising a metal material with a second layer comprising a metal material, wherein the first layer is part of the first substrate section and the second layer is part of the second substrate section.

6. The substrate device of claim 1, wherein the second substrate section is embedded within the first substrate section.

7. The substrate device of claim 1, wherein the first substrate section and the second substrate section are included in a bent substrate.

8. The substrate device of claim 4, wherein at least one metal layer is patterned for forming an electric wiring or circuit in an associated plane.

9. The substrate device of claim 1, wherein the first substrate section has a thickness perpendicular to the first orientation, and the second substrate section has a height along the second orientation that is less or equal than the thickness of the first substrate section.

10. A method for manufacturing a substrate device comprising:
    providing a first substrate section comprising a first plurality of layers attached to each other, wherein the first plurality of layers have a first orientation parallel to planes associated with the layers of the first plurality of layers;
    forming an opening in the first substrate section, and;
    inserting a second substrate section having a second plurality of layers attached to each other into the opening, wherein the second plurality of layers have a second orientation parallel to planes associated with the layers of the second plurality of layers such that the first orientation and the second orientation are perpendicular with respect to one another.

11. The method of claim 10 further comprising:
    providing through vias in the first substrate section, and;
    electrically coupling the through vias with the second substrate section.

12. The method of claim 10 further comprising:
    providing a patterned layer covering at least the inserted second substrate section for adjusting protruding layer sections of the second substrate section to a predetermined pattern.

* * * * *